United States Patent
Khatri et al.

(10) Patent No.: US 7,880,505 B2
(45) Date of Patent: Feb. 1, 2011

(54) LOW POWER RECONFIGURABLE CIRCUITS WITH DELAY COMPENSATION

(76) Inventors: Sunil Papanchand Khatri, 4904 Hazeltine Ct., College Station, TX (US) 77845; Sheila Vaidya, 46580 Sentinel Dr., Fremont, CA (US) 94539; Timothy Kevin Griffin, 902 Dogwood Hill Ct., Towson, MD (US) 21286; Nikhil Jayakumar, 1168 Morse Ave., Apt. 210, Sunnyvale, CA (US) 94089

( * ) Notice: Subject to any disclaimer, the term of this patent is extended or adjusted under 35 U.S.C. 154(b) by 0 days.

(21) Appl. No.: 12/709,227

(22) Filed: Feb. 19, 2010

(65) Prior Publication Data
US 2010/0213978 A1 Aug. 26, 2010

Related U.S. Application Data

(60) Provisional application No. 61/154,214, filed on Feb. 20, 2009.

(51) Int. Cl.
*H03K 19/00* (2006.01)

(52) U.S. Cl. ......................................... 326/93; 326/26
(58) Field of Classification Search ................... 326/21, 326/26–28, 93–98
See application file for complete search history.

(56) References Cited

U.S. PATENT DOCUMENTS

| | | | |
|---|---|---|---|
| 7,602,859 B2* | 10/2009 | Cheng et al. | 375/316 |
| 2002/0030524 A1* | 3/2002 | Fifield et al. | 327/278 |
| 2009/0116312 A1* | 5/2009 | Carpenter et al. | 365/194 |
| 2010/0194469 A1* | 8/2010 | Amrutur et al. | 327/538 |

* cited by examiner

*Primary Examiner*—Don P Le
(74) *Attorney, Agent, or Firm*—A. Bukoye; Jackson Walker LLP

(57) ABSTRACT

According to one aspect of the present disclosure, a circuit includes a semiconductor device including a plurality of logic blocks and a plurality of programmable interconnects. A delay detector generates a delay signal responsive to a measured delay of an output signal, wherein the output signal is from at least one of the plurality of logic blocks. A biasing circuit responsive to the delay signal to adjust subsequent measured delays toward a predetermined value.

27 Claims, 3 Drawing Sheets

LOW POWER RECONFIGURABLE CIRCUITS WITH DELAY COMPENSATION

CROSS REFERENCE TO RELATED APPLICATIONS

This application claims priority to U.S. Provisional Application No. 61/154,214 filed Feb. 20, 2009, entitled "Low Power Reconfigurable Circuits with Delay Compensation."

REFERENCE REGARDING FEDERALLY SPONSORED RESEARCH OR DEVELOPMENT

This invention was made with government support under a subcontract awarded by Lawrence Livermore National Laboratory, subcontract number C06-00255 and prime contract number W-7405-ENG-48 awarded by DOE/NNSA. The government has certain rights in the invention.

BACKGROUND

1. Field of the Disclosure

The present disclosure generally relates to electrical circuits and more particularly to low power reconfigurable circuits with adaptive delay compensation.

2. Description of the Related Art

Certain types of electrical circuits include field programmable gate arrays (FPGAs). In the prior art, FPGAs are typically operated using voltages above a minimum threshold value, which value is considered to be within a normal operating range.

FPGAs include programmable logic components called "blocks," "slices" or "configurable logic blocks" that are connected together with programmable interconnects. The logic blocks may be programmed to perform basic functions such as AND, EXCLUSIVE OR (XOR), or more complex Boolean functions, including arithmetic functions. Logic blocks may include elements such as flip flops or complete blocks of memory.

SUMMARY OF THE INVENTION

According to one aspect of the present disclosure, a circuit includes a semiconductor device including a plurality of logic blocks and a plurality of programmable interconnects. A delay detector generates a delay signal responsive to a measured delay of an output signal, wherein the output signal is from at least one of the plurality of logic blocks. A biasing circuit responsive to the delay signal to adjust subsequent measured delays toward a predetermined value.

According to another aspect of the present disclosure, a low power circuit includes a field programmable gate array circuit having a reference block, wherein the reference block produces a reference output signal. The reference output signal is generated by a sub-threshold leakage current, and includes a reference output phase signal. A phase detector is adapted to determine a delay by comparing the reference output phase signal to a reference delay signal. A charge pump responsive to an indication of the delay biases the reference output signal toward the reference delay signal.

According to a further aspect of the present disclosure, a method includes the steps of: operating a reference block within a field programmable gate array circuit at a sub-threshold level to produce an output, wherein the output has an output delay, and dynamically biasing a portion of the field programmable gate array (FPGA) to increase or decrease the output delay toward a predetermined delay.

Other aspects and advantages of the present disclosure will become apparent upon consideration of the following description.

BRIEF DESCRIPTION OF THE DRAWINGS

Throughout the FIGS., like or corresponding reference numerals have been used for like or corresponding parts.

DESCRIPTION OF THE EMBODIMENT(S)

Figure 1:
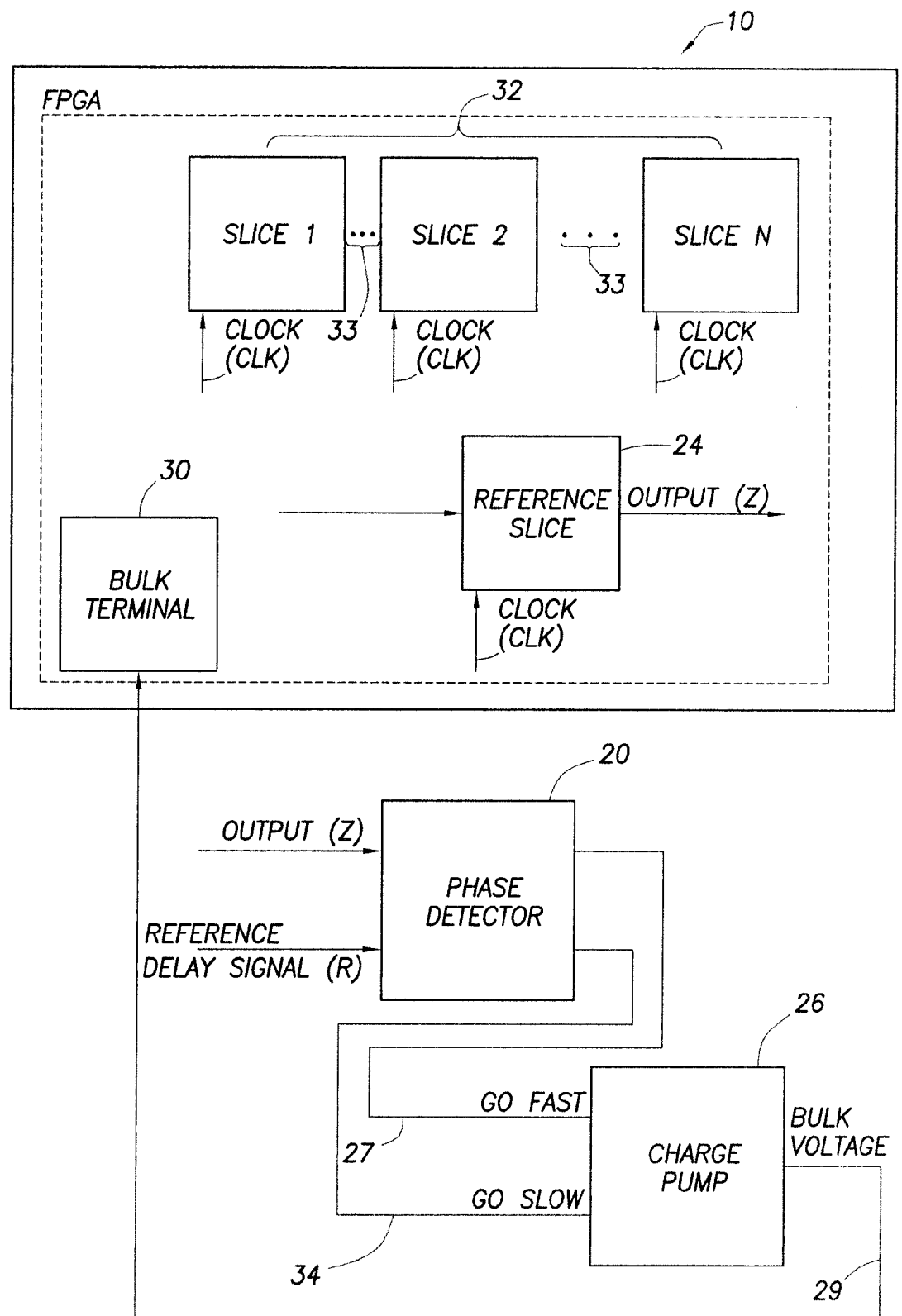
FIG. 1 illustrates circuits that utilize sub-threshold currents and configurable circuit devices with delay correction elements according to a first embodiment.

FPGAs may be slower than application specific integrated circuits (ASICs). In addition, FPGAs sometimes draw more power than an ASIC design. In the embodiments of the invention, the primary objective is to provide a circuit design with extremely low power requirements, and wherein circuit speed is a secondary design goal. For example, in the fields of sensor networks and wearable computers, it may be primarily important for circuits to use extremely low power. Thus, disclosed embodiments of the invention are intended to use lower power consumption than typical very large scale integrated (VLSI) designs. Some embodiments disclosed herein are designed to permit a battery-free, ambient light powered reconfigurable VLSI circuit that is operated at or near a sub-threshold voltage supply, thereby ensuring that the circuit utilizes sub-threshold currents. The sub-threshold voltage supply is a supply voltage that has a value that is below or near the threshold voltage for a given device, for example, MOSFET device. Disclosed embodiments provide new methods, apparatuses, and circuitry for performing VLSI circuit design, so that the amount of power consumed by the circuit is significantly reduced.

In some embodiments, the circuit power is reduced by using reconfigurable logic elements such as FPGAs. In other embodiments, lower power consumption is achieved using sub-threshold current. Traditionally, sub-threshold currents have not been used for circuit switching. Instead, circuit switching has been performed using linear and saturation currents. However, embodiments disclosed herein, while sub-threshold currents are extremely small, they do allow circuits to operate at very low power and energy levels. When using sub-threshold currents as discussed herein, compensation may be required for the dependence of the delay of the sub-threshold circuit on semiconductor processing or fabrication, operating voltage, and temperature variations (i.e., PVT variations). Semiconductor processing or fabrication variations typically manifest as variations in the threshold voltage. Disclosed embodiments may use dynamic body biasing to ensure that the performance (speed) of a reconfigurable design is substantially constant, regardless of the PVT conditions.

Notwithstanding the foregoing, in the prior art, reconfigurable circuit designs are popular as a means to implement digital designs. This is in part due to increasing performance as technology progresses, which allows the reconfigurable designs to become viable for a larger set of applications. At the same time, custom or applications specific integrated circuits are becoming increasingly expensive to design and implement due to significant fabrication costs in the VLSI industry. A popular prior art form of reconfigurable circuit is the FPGA typically addressed by some embodiments disclosed herein. In such disclosed embodiments, FPGA designs use PVT variation compensation methods. VLSI integrated circuits may be fabricated to validate the operation of FPGA designs that use PVT variation compensation methods. The disclosed embodiments allow for digital designs to be realized with relatively low power consumption, which may be 100 to 500 times lower than known approaches. Decreased non-recurring engineering (NRE) costs and low power consumption provide disclosed embodiments with vast applicability in terms of the variety of designs that can be implemented.

Non-reconfigurable sub-threshold designs may also be implemented in accordance with the disclosed embodiments to achieve significant power reductions in power requirements compared to other known approaches. In addition, asynchronous (quasi-delay insensitive or micro-pipelined) approaches, when implemented in a sub-threshold manner, may be used with the disclosed embodiments. Such applications may help to reclaim some of the reduction in speed penalty associated with some embodiments. The disclosed embodiments may be used in tandem with regular (i.e., super-threshold) design approaches with the ability to, on the same hardware platform, achieve both extremely low power at a reduced speed, as well as very high speeds with a higher power requirement, albeit not simultaneously. As would be known to one of ordinary skill in the art, the disclosed embodiments may be incorporated within 3D VLSI designs to allow for faster applications. The low power consumption and associated lowered heat generation may aid in 3D integration. Alternatively, the disclosed embodiments could be implemented using current mode operation as will be known to persons of skill in the art.

In accordance with certain disclosed embodiments of the invention, low power circuits can be made reconfigurable. PVT variations may be addressed using dynamic body biasing. Such implementations may be incorporated into circuits that use FPGAs. Some embodiments implement a combinational lookup table (LUT) of an FPGA using all NMOS devices and modulate their bulk terminal (or body terminal) using a phase detector or delay detector, biasing circuit or charge pump, and reference signal (e.g., a reference or "beat" clock). If needed, PMOS devises may also be separately bulk modulated. As known to those of ordinary skill in the art, bulk terminals including Pbulk terminals and Nbulk terminals of several FPGA configurable logic blocks (CLBs) or slices (which contain LUTs and flops) may be shared.

FIG. 1 depicts an example semiconductor device or circuit 10 that employs sub-threshold currents and configurable circuit elements (i.e., FPGAs) with delay correction elements, and interconnects as discussed below. As shown in FIG. 1, a phase detector 20 receives an output Z from a reference slice 24. A clock signal CLK and reference delay signal (R) are external signals and the other elements shown in FIG. 1 may be implemented on a single chip. As shown in FIG. 1, the output Z switches after the clock signal CLK switches. The delay of the output Z can vary widely due to variations (e.g., PVT variations), if not compensated for. To compensate, the phase detector in FIG. 1 compares the delay of the output Z with the reference delay signal R. If the delay of output Z is greater than that of reference delay signal R, the delay detector or phase detector 20 generates go fast pulses 27. The go fast pulses 27 cause the biasing circuit or charge pump 26 to generate an increase in output bulk voltage 29. Since the charge pump output is connected to a bulk terminal 30 of the reference slice 24, in addition to other slices 32 that are connected by interconnects 33, the circuit 10 speeds up to keep the same speed as delay signal R. Conversely, if the delay of output Z is less than that of reference delay signal R, the circuit 10 may be going too fast. In response to such a condition, go slow pulses 34 are generated to cause the bulk voltage 29 to drop. The drop in the bulk voltage 29 slows down all slices 32 so that the delay of the output Z approaches that of the reference delay signal R. In this way, a form of dynamic body biasing is implemented in FIG. 1 which self-compensates the delay of all slices 32 to match the delay signal R. Typically, this biasing occurs on the fly, without user intervention. A plurality of compensation circuits may be used in an IC, each driving the shared bulk terminal of several slices.

Without the biasing techniques disclosed herein, sub-threshold designs have been simulated in a circuit simulator to be extremely sensitive to PVT variations. Such sensitivity to PVT variations would render commercial implementations that use sub-threshold designs not viable. The sensitivity of sub-threshold circuits to PVT variations has been shown to be exponential.

Disclosed embodiments may be used for PMOS (p-channel metal oxide semiconductor) devices as well as NMOS (n-channel metal oxide semiconductors) devices. Dynamic body biasing, as disclosed herein, may be required for FPGAs to operate in sub-threshold levels. Disclosed embodiments may be amenable to non-FPGA design styles as well. The LUTs in a slice may be implemented as a tree of pass gates (NMOS) and therefore have a certain number of NMOS devices. Therefore NMOS bulk biasing as utilized in disclosed embodiments may be particularly beneficial. The designs discussed herein for disclosed embodiments may be implemented in situations that require low power consumption in the range of 100-500 times lower than presently known values due to the use of sub-threshold currents.

In some embodiments, to account for sensitivity to variations (for example, supply voltage, threshold voltage, temperature) in sub-threshold circuits, adjustments are achieved by performing bulk voltage adjustments in a closed-loop fashion, using the charge pump 26 and the phase-detector 20.

In traditional digital VLSI design, the sub-threshold region of operation is not utilized beneficially. Circuit operation is based purely on linear or saturation mode currents, and sub-threshold currents are viewed as an attendant evil, since they contribute towards leakage power consumption when the device is in stand-by. In disclosed embodiments this problem is turned into an opportunity. Sub-threshold leakage currents are utilized to implement circuits by setting the circuit power supply $V_{DD}$ (i.e., the input voltage) to a value less than or equal to $V_T$ (i.e., the threshold voltage). This choice results in smaller conduction currents and power, but also longer circuit delays.

In circuit simulator experiments to compare the delay of a circuit implemented using sub-threshold CMOS logic versus traditional CMOS logic, a comparison can be made regarding the delay and power values of both schemes, for a given Deep Sub-micron (DSM) fabrication process. The device technologies may be Berkeley Predictive Model 0.1 μm and 0.07 μm fabrication processes as known to persons of ordinary skill in the art. For these fabrication processes, $V_{TN}$ and $V_{TP}$ may be determined to be, respectively, 0.261V and −0.303V (for the 0.1 μm process) and 0.21V and −0.22V (for the 0.07 μm fabrication process).

Figure 2:
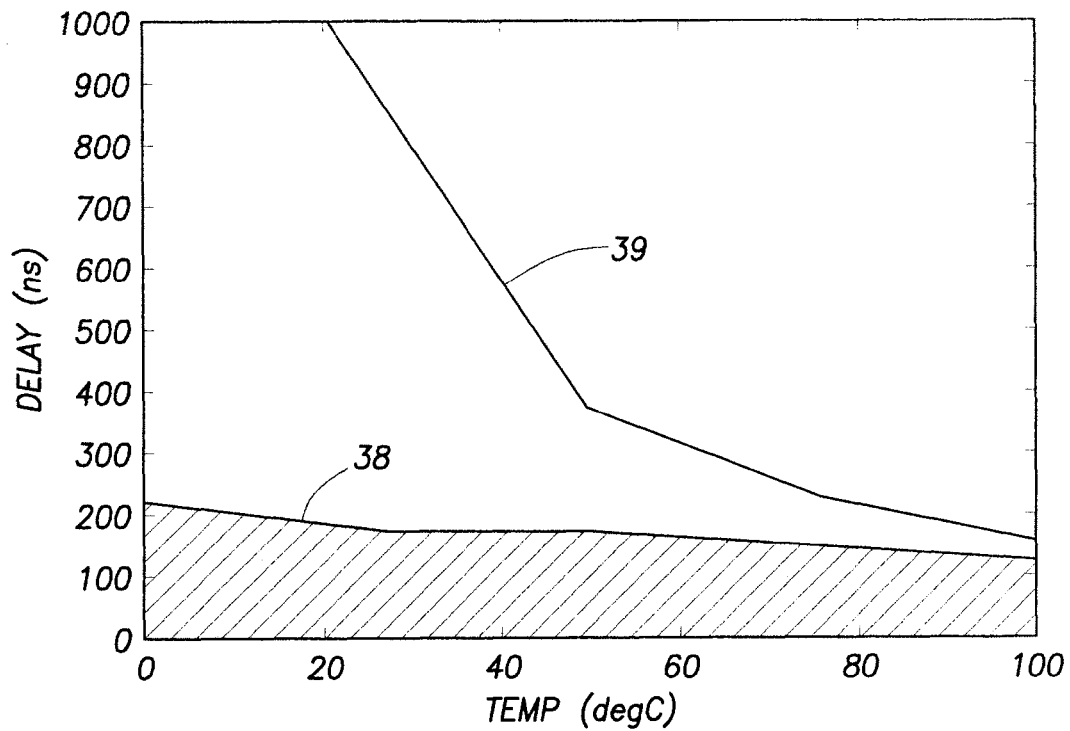
FIG. 2 depicts a graph showing a delay variation implemented by the circuits of FIG. 1.

A comparison of compensated versus non-compensated sub-threshold circuit delays is shown in FIG. 2. The region 38

(FIG. 2) represents an example delay variation after a self-adjusting body bias technique is applied, while the region 39 represents an example delay variation without any delay compensation. For each process, a 21-stage ring oscillator circuit may be constructed using minimum-sized inverters. From this circuit, a delay may be computed as well as power delay products for both sub-threshold circuit and traditional circuit design. At a junction temperature of 120° C., for both bsim 70 and bsim 100 fabrication processes, impressive power reductions may be obtained, and the power delay product (with zero body bias) of 20× improvement may be achieved compared to a traditional design style. The delay penalty can be further reduced by applying a slightly positive body bias. When the body is biased to $V_{DD}$ (which is set at $V_T$ in these simulations), the delay can be brought down by a factor of two, while the power-delay product still remains around 10 times better. At this operating point, upwards of 100× power reductions may be achieved.

Self-adjusting body bias, to phase lock the circuit delay to the delay signal R, may be used. This phase locking is done for a group of blocks in an FPGA that may share a common Nbulk and/or Pbulk terminals. This Nbulk terminal may be driven by a bulk terminal (one per FPGA block group), whose task it is to synchronize the delay of a reference FPGA block to the delay signal R, which may be globally distributed.

Figure 3:
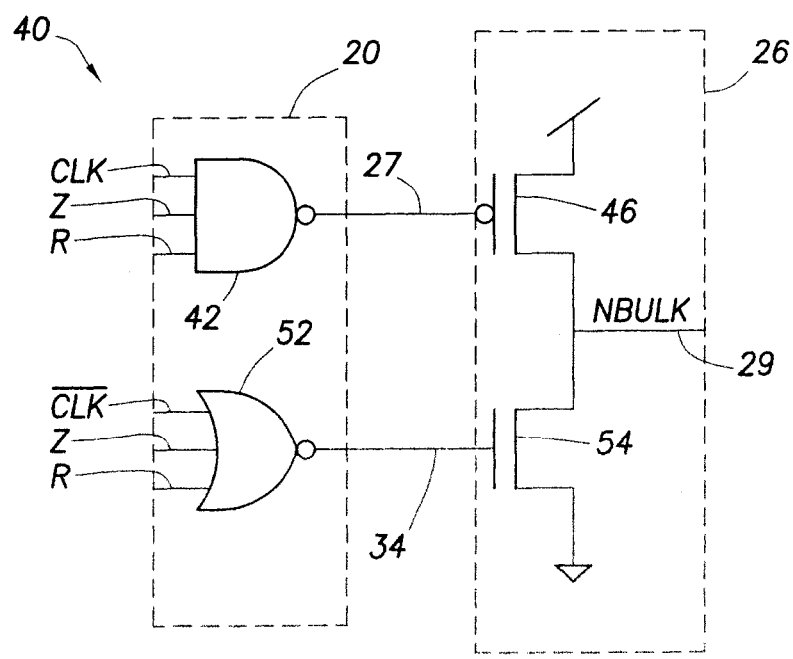
FIG. 3 illustrates an embodiment of the circuits of FIG. 1.
Figure 4:
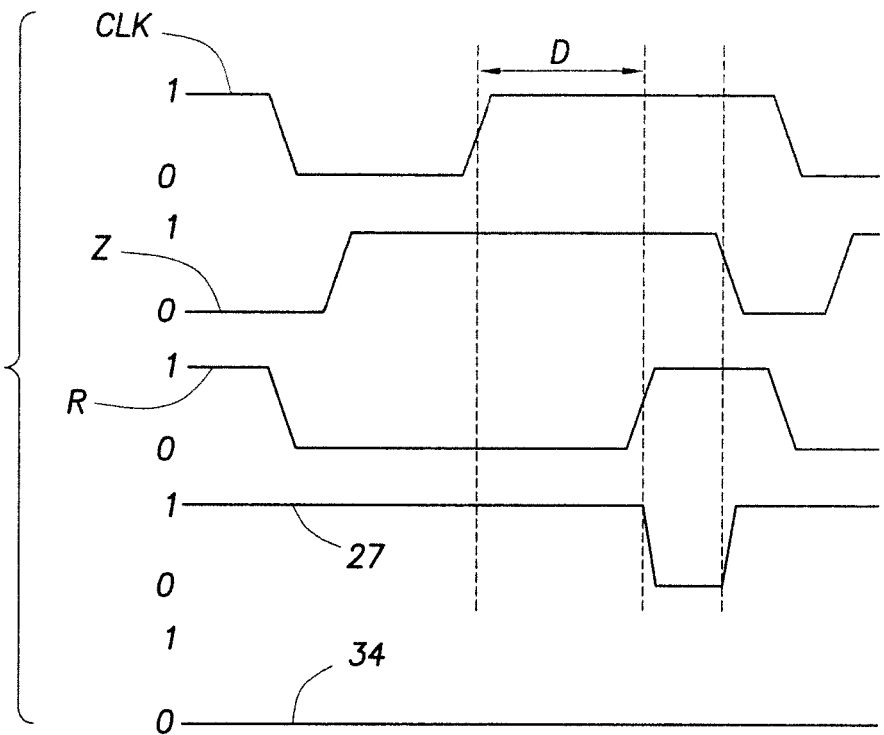
FIG. 4 shows waveforms that are produced by the circuits of FIG. 1 where an output signal lags a clock signal.

A self adjusting circuit 40 including phase detector 20 and charge pump 26 can be realized as shown in FIG. 3. A NAND gate 42 detects a condition where the output Z is too slow, and generates low-going pulses in such condition. These pulses are used to turn on a PMOS device 46, which increases the Nbulk bias voltage 29, resulting in a speed-up in the FPGA. The waveforms of the signals for this case are shown in FIG. 4. Note that in general, the delay signal R is derived from CLK, having coincident falling edges with CLK but a rising edge which is delayed by a quantity D from the rising edge of CLK. This quantity D is the desired delay for the evaluation of all FPGA blocks. If the output Z has not changed state by the time the delay signal R rises, a downward pulse is generated on the pullup signal, which forces charge into the Nbulk terminal, resulting in faster generation of the output Z. Note that at this time, pulldown, the signal which is used to bleed off charge from Nbulk, is low. A NOR gate 52 in FIG. 3 generates high-going pulses to turn on an NMOS device 54 when the FPGA delay is less than D. These pulses drive the NMOS device 54 in FIG. 3, bleeding charge out of Nbulk and thereby slowing the PLA down. A similar circuit can be devised to control the Pbulk terminal.

Figure 5:
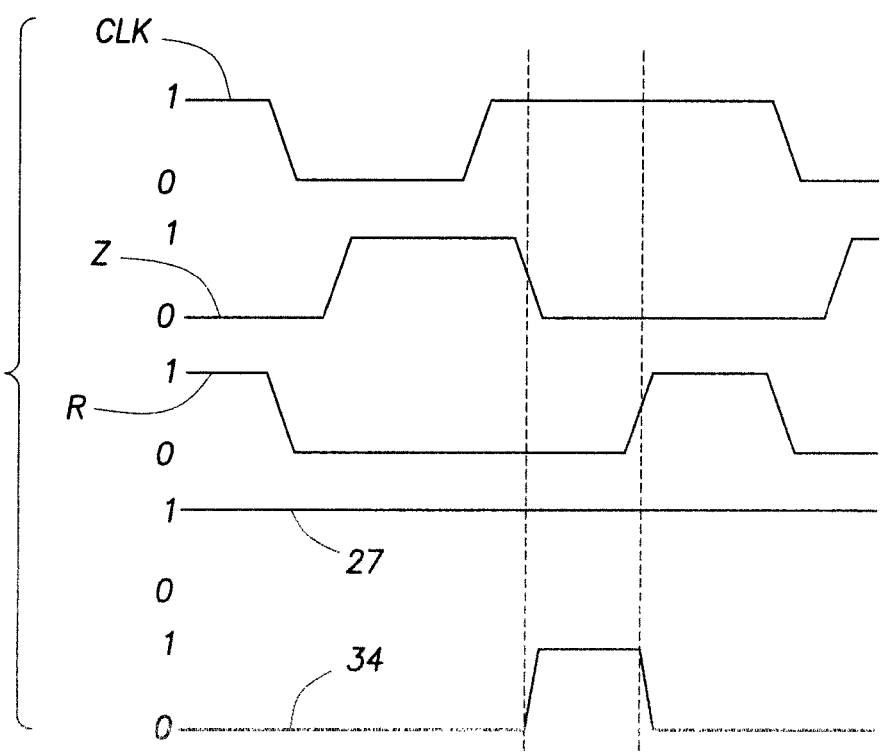
FIG. 5 shows waveforms produced by the circuits of FIG. 1 where the output signal leads the clock signal.

FIG. 4 shows waveforms for when the output signal (e.g., Z) lags the delay signal R. FIG. 5 shows waveforms for when the output signal (e.g., Z) lags the delay signal R. FIG. 6 shows waveforms for when the output signal (e.g., Z) leads the delay signal R. The distribution of a sub-threshold $V_{DD}$ signal may be challenging, but this challenge can be addressed by using a high quality power distribution methodology such as a layout fabric. For any process and $V_{DD}$ entry at any temperature, the highest speed possible may be when the voltage of the bulk terminal is maximum (i.e. set to the value of $V_{DD}$ for that simulation). Disclosed embodiments present sub-threshold design methodologies, which actively compensate for variations in supply voltage, temperature and threshold voltage values. The novelty of the approach is its ability to adapt to inter and intra-die PVT variations, enabling a significant performance improvement. The design has a global beat clock to which the delay of a group of FPGA blocks is "phase locked." The synchronization is performed in a closed-loop fashion, using a phase detector and a charge pump which drives the Nbulk (and/or Pbulk) terminals of the FPGA blocks. Disclosed embodiments may dynamically phase lock the FPGA block delays to the beat clock across a wide range of PVT variations, without user intervention.

While the disclosed systems may be described in connection with one or more embodiments, it is not intended to limit the subject matter of the claims to the particular forms set forth. On the contrary, disclosed systems are intended to include alternatives, modifications and equivalents as may be included within the spirit and scope of the subject matter as defined by the appended claims.

What is claimed is:

1. A circuit comprising:
   a semiconductor device having a plurality of logic blocks and a plurality of programmable interconnects;
   a delay detector for generating a delay signal responsive to a measured delay of an output signal, wherein the output signal is from at least one of the plurality of logic blocks, and
   a biasing circuit responsive to the delay signal to adjust a subsequently measured delays toward a predetermined value.

2. The circuit of claim 1, wherein at least one of the plurality of logic blocks is operated with a sub-threshold voltage.

3. The circuit of claim 1, wherein the logic blocks or interconnects are programmable.

4. The circuit of claim 2, wherein the reference value is derived from a beat clock.

5. The circuit of claim 2, wherein the measured delay is derived by comparing a phase of the output signal to the phase of a beat clock.

6. The circuit of claim 2, wherein the semiconductor device is a field programmable gate array, wherein the delay detector includes a phase detector, and wherein the biasing circuit includes a charge pump.

7. The circuit of claim 6, wherein the phase detector includes a gofast output and a goslow output, wherein a first input to the charge pump is responsive to the gofast output, and wherein a second input to the charge pump is responsive the goslow output.

8. The circuit of claim 7, wherein a bulk voltage for the semiconductor device is responsive to a charge pump output.

9. A low power circuit comprising:
   a field programmable gate array circuit including a reference block, wherein the reference block produces a reference output signal, wherein the reference output signal:
   is a sub-threshold leakage current or voltage; and
   includes a reference output signal phase,
   a phase detector adapted to determine a delay by comparing the reference output signal phase to a reference delay signal; and
   a charge pump responsive to an indication of the delay to bias the reference output signal toward the reference delay signal.

10. The circuit of claim 9, wherein the reference output signal switches in response to a clock signal provided to the reference block.

11. The circuit of claim 10, wherein the circuit is a dynamic body biasing circuit.

12. The circuit of claim 11, wherein the circuit includes a plurality of further blocks, wherein the circuit self-compensates a delay of the plurality of further blocks to approach the reference delay signal.

13. The circuit of claim 9, wherein the charge pump includes a charge pump output coupled directly or indirectly to a common bulk terminal of the field programmable gate array circuit.

14. The circuit of claim 13, wherein the charge pump output is responsive to an indication of a delay.

15. The circuit of claim 13, wherein the field programmable gate array circuit includes a lookup table, flip-flops, configurable logic blocks, or memories.

16. The circuit of claim 15, wherein the combinational lookup table is comprised of substantially all NMOS devices.

17. The circuit of claim 14, wherein the combinational lookup table comprises NMOS devices.

18. The circuit of claim 14, wherein a voltage of the charge pump output is increased if the indication of the delay includes information that rising edges of reference output signal occur after corresponding rising edges of the reference delay signal.

19. The circuit of claim 17, wherein the compensation is performed for Pbulk terminal alone, or for Nbulk and Pbulk terminals.

20. The circuit of claim 18, wherein a voltage of the charge pump output is decreased if the indication of the delay includes information that rising edges of the reference output signal occur before corresponding rising edges of the reference delay signal.

21. A method comprising the steps of:
    operating a reference block within a field programmable gate array circuit at a sub-threshold level to produce an output, wherein the output has an output delay; and
    dynamically biasing a portion of the FPGA to increase or decrease the output delay toward a predetermined delay.

22. The method of claim 21, wherein the step of dynamically biasing includes modulating a bulk terminal, wherein the predetermined delay is indicated by a reference delay signal, wherein the method further comprises:
    comparing the reference delay signal to the output delay; and
    adjusting an input voltage to the FPGA bulk terminal based on the comparison.

23. The method of claim 21, wherein the step of adjusting an input voltage includes a step of providing a further input to a charge pump to result in the input voltage increasing or decreasing.

24. The method of claim 22, wherein the step of comparing the reference delay signal to the output delay is performed by a phase detector.

25. The method of claim 21, wherein the FPGA circuit operates in a quasi-delay insensitive, micro-pipelined or asynchronous fashion.

26. The method of claim 21, wherein the FPGA circuit is realized using 3D integration.

27. The method of claim 21, wherein the FPGA circuit is realized using current mode operation.

* * * * *